(12) United States Patent
Lassila et al.

(10) Patent No.: US 6,268,115 B1
(45) Date of Patent: *Jul. 31, 2001

(54) USE OF ALKYLATED POLYAMINES IN PHOTORESIST DEVELOPERS

(75) Inventors: Kevin Rodney Lassila, Macungie; Kristen Elaine Minnich; Richard Van Court Carr, both of Allentown, all of PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/478,483

(22) Filed: Jan. 6, 2000

(51) Int. Cl.$^7$ ....................................................... G03F 7/32
(52) U.S. Cl. .......................... 430/331; 430/322; 510/176
(58) Field of Search ........................... 510/176; 430/331, 430/322

(56) References Cited

U.S. PATENT DOCUMENTS

| | | | |
|---|---|---|---|
| 4,628,023 | 12/1986 | Cswston et al. | 430/331 |
| 4,741,989 | 5/1988 | Niwa et al. | 430/331 |
| 4,997,748 | 3/1991 | Takeda et al. | 430/331 |
| 5,039,595 | 8/1991 | Schwalm et al. | 430/326 |
| 5,252,436 | 10/1993 | Binder et al. | 430/326 |
| 5,939,476 | * | 8/1999 | Lassila et al. | 524/251 |
| 6,044,851 | * | 4/2000 | Grieger et al. | 134/1.3 |
| 6,103,799 | * | 8/2000 | Lassila et al. | 524/251 |

FOREIGN PATENT DOCUMENTS

| | | |
|---|---|---|
| 0930346 | 7/1999 | (EP) . |
| 63-34542 | 2/1988 | (JP) . |
| 3-062034 | 3/1991 | (JP) . |

OTHER PUBLICATIONS

Microlithography, Science and Technology, edited by J. R. Sheats and B. W. Smith, Marcel Dekker, Inc. 1998 pp 551–553.

* cited by examiner

*Primary Examiner*—Hoa Van Le
(74) *Attorney, Agent, or Firm*—Michael Leach

(57) ABSTRACT

This invention provides water-based photoresist developer/electronics cleaning compositions manifesting reduced equilibrium and dynamic surface tension by the incorporation as surfactant of an effective amount of certain dialkyl polyamine compounds of structures I or II

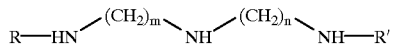

where R and R' are independently C5 to C8 alkyl, G is a C2–C6 linear or cyclic alkylene group which may contain C1–C4 alkyl substituents, m is 2–6, and n is 2 or 3.

21 Claims, No Drawings

USE OF ALKYLATED POLYAMINES IN PHOTORESIST DEVELOPERS

FIELD OF THE INVENTION

The invention relates to the use of alkylated polyamines as a wetting agent in aqueous photoresist developer and electronics cleaning compositions.

BACKGROUND OF THE INVENTION

The demands of semiconductor manufacture have required the use of high performance surfactants and wetting agents in photoresist developer formulations. As line features shrink to smaller sizes and photoresist substrate materials become more aliphatic in nature (i.e. having lower surface energy), aqueous developer solutions are being formulated with surface tension reducing agents. Another requirement for these developers is that they have a low tendency to foam. This is accentuated by the movement toward larger wafer sizes. Low foam formation is particularly important when using spray-puddle techniques because microbubble entrainment during spreading of the solution over the photoresist surface can lead to defects. Surfactants that have been used in the past to increase wetting of the photoresist typically lead to higher foam formation. For the most part the industry has focused on the effect of surfactant on photoresist performance, such as contrast, critical dimension, and feature sharpness. Although the cleaning ability of underlying substrates is enhanced by typical surfactants, foam formation still remains a problem.

Tetramethylammonium hydroxide (TMAH) is the chemical of choice in aqueous alkaline solutions for developing photoresists according to *Microlithography, Science and Technology*, edited by J. R. Sheats and B. W. Smith, Marcel Dekker, Inc., 1998, pp 551–553. Surfactants are added to the aqueous TMAH solutions to reduce development time and scumming and to improve surface wetting.

U.S. Pat. No. 5,939,476 discloses the use of alkylated polyamines for reducing equilibrium and dynamic surface tension of water-based compositions.

EP 0 930 346 corresponding to U.S. application Ser. No. 09/009,099 filed Jan. 20, 1998 discloses the use of N,N'-dialkyl alkylenediamines for reducing equilibrium and dynamic surface tension of water-based compositions.

There are few references describing low foam surfactants in developer compositions. JP 10-319606 discloses that commercially available ethylene oxide (EO)/propylene oxide (PO) block polymers give good wetting and low foam.

JP 03-062034 discloses polyoxyalkylene dimethyl polysiloxanes as good surfactants with low foam in developer formulations. Polysiloxanes are known to rearrange or decompose under conditions of high pH.

Although there are a few references to the use of amines in photoresist developer compositions, they are not related to the use of surface active agents. U.S. Pat. No. 5,252,436 discloses the use of relatively high levels of amine additives (3–30 wt %) and U.S. Pat. No. 5,039,595 uses amine additives at levels of 5–50 wt %. Both of these disclosures appear to be using the amines to alter the bulk solvent properties of the developer solution.

U.S. Pat. No. 4,997,748 discloses cyclic nitrogen compounds at levels of 0.1 to 10 wt % to decrease scum formation and enhance image sharpness during photoresist development. Among the cyclic nitrogen compounds taught is the cyclic urea 1,3-dimethyl-2-imidazolidinone. Since the nitrogen compounds are not amphipathic, it is not likely that they will lower surface tensions at low concentrations, and their utility appears to be based on properties other than surface tension reduction. 1,3-dimethyl-2-imidazolidinone is well known as a very good solvent and not as a surface-active material.

U.S. Pat. No. 4,828,965 discloses the use of lower alkanolamines (1–4 carbons) in combination with alcohols at concentrations of 0.40–5 wt %.

U.S. Pat. No. 4,741,989 discloses the use of small amounts of amines to modify the reaction chemistry of the quinonediazide photoactive compounds in photoresists, but only small chain amines are used and no surface active amines are cited.

U.S. Pat. No. 4,628,023 discloses water soluble amines as the alkali source for developer solutions. Because the preferred pH range is above 12.5, the use of organic amines would necessarily be at high concentrations.

JP 61-179651 discloses the use of amine-containing developer solutions with surface tensions of between 25 and 50 dyne/cm. These surface tensions are achieved by the use of relatively large amounts of non-surface-active amines (3–5 wt %) in combination with tetramethylammonium hydroxide as the base.

SUMMARY OF THE INVENTION

This invention provides water-based photoresist developing, or electronics cleaning, compositions having reduced equilibrium and dynamic surface tension by incorporation of an effective amount of an alkylated polyamine compound of the following structures I and II:

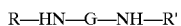

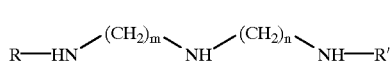

where R and R' are independently C5 to C8 alkyl, G is a C2–C6 linear or cyclic alkylene group which may contain C1–C4 alkyl substituents, m is 2–6, and n is 2 or 3.

By "water-based", "aqueous" or "aqueous medium" we mean, for purposes of this invention, a solvent or liquid dispersing medium which comprises at least about 90 wt %, preferably at least about 95 wt %, water. Obviously, an all water medium is also included and is most preferred. Also for purposes of the present invention, the terms "photoresist developing" and "electronics cleaning" are interchangeable.

Also provided is a method for developing a photoresist after exposure to radiation by applying to the photoresist surface a water-based developer composition containing an effective amount of an alkylated polyamine compound of the above structures for reducing the dynamic surface tension of the developer composition.

There are significant advantages associated with the use of these alkylated polyamine compounds in water-based photoresist developer, or electronics cleaning, compositions and these advantages include:

an ability to control the foaming characteristics of the water-based compositions; and an ability to formulate low surface tension aqueous electronics cleaning and processing solutions, including photoresist developer solutions, for the semiconductor manufacturing industry with good wetting and extremely low foam.

The use of these materials in photoresist developer formulations is of particular importance because of their ability to provide all the advantages of surface tension lowering plus outstanding performance in reducing the formation of foam and doing so while maintaining good contrast for photoresist developing applications.

DETAILED DESCRIPTION OF THE INVENTION

This invention relates to the use of compounds of the formulas I and II

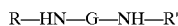
R—HN—G—NH—R'  I where R and R' are independently C5 to C8 alkyl, and G is a C2–C6 linear or cyclic alkylene group which may contain C1–C4 alkyl substituents, and II
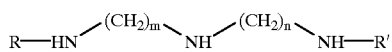

where R and R' are independently C5 to C8 alkyl groups and m is 2–6 and n is 2 or 3, with m being 2 or 3 preferred; for the reduction of equilibrium and dynamic surface tension and low foaming in water-based photoresist developer formulations. It is desirable that an aqueous solution of the dialkylated polyamine demonstrates a dynamic surface tension of less than 45 dynes/cm at a concentration of $\leq 5$ wt % in water at 23° C. and 1 bubble/second according to the maximum-bubble-pressure method. The maximum-bubble-pressure method of measuring surface tension is described in *Langmuir* 1986, 2, 428–432, which is incorporated by reference.

The dialkylated polyamines comprising N,N'-dialkyl alkylenediamines and N,N"-dialkyl dialkylenetriamines which are suitable for use in the present invention are those alkylated polyamines taught in EP 0 930 346 and U.S. Pat. No. 5,939,476, respectively. These references also teach how to make these dialkyl polyamines.

Generally, in the practice of this invention, it is desirable to use alkylated polyamines having a solubility in water of at least 0.001 wt %, preferably from 0.001 to 1 wt %, and most preferably from 0.005 to 0.5 wt %.

The alkyl groups may be the same or different. They may be linear or branched, and the point of attachment to the nitrogen of the polyamine may be on either an internal or terminal carbon. Suitable alkyl groups are derived from reductive alkylation reactions of a C5 to C8 aldehyde or ketone, preferably derived from reductive alkylation reactions of methyl isobutyl ketone or methyl isoamyl ketone. Specific examples of suitable C5 to C8 aldehydes and ketones include 1-pentanal, 2-pentanone, 3-pentanone, methyl isopropyl ketone, 1-hexanal, 2-hexanone, 3-hexanone, methyl tert-butyl ketone, ethyl isopropyl ketone, 1-heptanal, 2-methylhexanal, 2-heptanone, 3-heptanone, 4-heptanone, 1-octanal, 2-octanone, 3-octanone, 4-octanone, 2-ethylhexanal, and so on. The specific carbonyl compound chosen and the number attached to the polyamine derivative will depend on the surfactant properties required for a particular application.

An amount of the dialkylated polyamine compound that is effective to reduce the equilibrium and/or dynamic surface tension of the water-based photoresist developer/electronics cleaning composition is added. Such effective amount may range from 0.001 to 1 g/100 ml, preferably 0.005 to 0.5 g/100 ml, of the aqueous composition. Naturally, the most effective amount will depend on the particular application and the solubility of the dialkylated polyamine.

The use of the dialkylated polyamine as a surfactant is particularly advantageous in the developers for photoresists that are employed in the semiconductor industry. Such developers and their use are well known in the art and do not need to be described in detail. The improvement provided by this invention, which could not have been foreseen, involves the use in these developer formulations of certain dialkylated polyamines containing 5 to 8 carbon atoms in each alkyl group on the nitrogen atoms.

In the following water-based photoresist developer, or electronic cleaning, composition containing a dialkylated polyamine according to the invention, other optional components of such compositions are those materials well known to the workers in the art. A typical water-based photoresist developer, or electronic cleaning, composition to which the dialkylated polyamines may be added would comprise an aqueous medium containing the following components:

| Water-Based Photoresist Developer Composition | |
|---|---|
| 0.1 to 3 wt % | Tetramethylammonium Hydroxide |
| 0 to 4 wt % | Phenolic Compound |
| 10 to 10,000 ppm | Alkylated Polyamine |

Briefly, the process for manufacture of integrated circuits involves the application of a film of photoresist composition to a suitable substrate, such as a silicon wafer, which is then exposed to actinic radiation in a design pattern that is imposed upon the photoresist film. Depending upon whether the photoresist is positive or negative-working, the radiation either increases or decreases its solubility in a subsequently applied developer solution. Consequently, in a positive-working photoresist the areas masked from the radiation remain after development while the exposed areas are dissolved away. In the negative-working photoresist the opposite occurs. The surfactant of this invention can be used in developers for either type of photoresist. The character of the developer is very important in determining the quality of the circuits formed and precise control of developing is essential. To achieve better surface wetting by the developer is has been common to add surfactant to the formulation in order to reduce surface tension of the solution. This addition, however, can cause the developer to foam which leads to circuit defects. This foaming problem is also recognized in the art and considerable attention in the industry has been directed toward its solution.

The aqueous developer, or electronics cleaning, solutions in which use of the dialkylated polyamines is preferred are the aqueous solutions of tetramethylammonium hydroxide (TMAH). These developers are also well known in the art. Commercial developers usually contain low levels of surfactant on the order of 50 to 1000 ppm by weight. Surfactant level should not exceed that required to achieve the desired surface tension of the solution. For example, surface tensions of about 40 to 45 dynes/cm would be appropriate for novolac-based photoresist resins. Advanced resins that often incorporate aliphatic groups might require a developer with lower surface tension to enhance wetting. One of the advantages of the surfactants of this invention is that suitable surface tensions can be obtained at lower levels than is required by other wetting agents. This in itself is a step toward solving the foaming problem in the manufacture of microcircuitry.

The disclosures of U.S. Pat. No. 5,939,476 and U.S. application Ser. No. 09/009,099 filed Jan. 20, 1998, which patents relate to the use of dialkylated polyamines as surfactants in aqueous compositions, are hereby incorporated by reference.

EXAMPLE 1

This example illustrates the procedure for the preparation of the reductive alkylation product of diethylenetriamine and methyl isobutyl ketone (DETA/MIBK2) having the following structure:

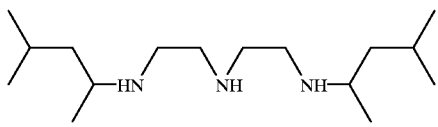

Diethylenetriamine (0.5 mole), methyl isobutyl ketone (2.0 mole) and 5% Pd/C (4 wt % of total charge) were charged to a one liter stainless steel autoclave. The reactor was sealed and purged with nitrogen then hydrogen. The contents of the reactor were heated to 90° C. under 7 bar (100 psig) $H_2$. The pressure was increased to 55 bar (800 psig) and maintained throughout the reaction (9 hours) by the admission of hydrogen from a 1 gallon ballast on demand by a dome regulator. The reactor contents were analyzed by GC/FID and found to be 92.4 area % dialkylated and 2.7% trialkylated diethylenetriamine. The dialkylated product 2,4,12,14-tetramethyl-5,8,11-triazapentadecane was purified by distillation at 145–146° C., 6.6 millibar (5 Torr).

EXAMPLE 2

This example illustrates the procedure for the preparation of the reductive alkylation product of diethylenetriamine and methyl isoamyl ketone (DETA/MIAK2) having the following structure:

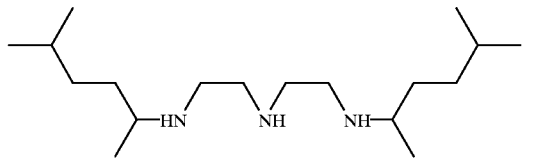

Diethylenetriamine (1.5 mole), methyl isoamyl ketone (3.2 mole) and 10% Pd/C (2.4 wt % of total charge) were charged to a one liter stainless steel autoclave and reacted as in Example 1 for 5 hours. The reactor contents were analyzed by GC/FID and found to be 92.4 area % dialkylated diethylenetriamine. The product 2,5,13,16-tetra-methyl-6,9,12-triazaheptadecane was purified by distillation at 155–157° C., 2.7 millibar (2 Torr).

EXAMPLE 3

This example illustrates the procedure for the preparation of the reductive alkylation product of di-(3-aminopropyl)amine and methyl isobutyl ketone (DAPA/MIBK2) having the following structure:

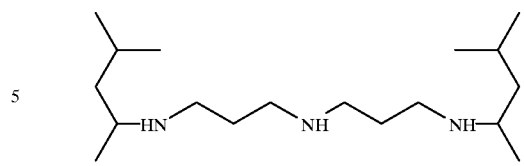

Di-(3-aminopropyl)amine (0.8 mole), methyl isobutyl ketone (1.5 mole) and 10% Pd/C (4 wt % of total charge) were charged to a one liter stainless steel autoclave and reacted as in Example 1 for 6 hours. The reactor contents were analyzed by GC/FID and found to be 95.8 area % dialkylated di-(3-aminopropyl)amine. The product 2,4,14,16-tetramethyl-5,9,13-triazaheptadecane was purified by distillation at 125–130 C., 0.53 millibar (0.4 Torr).

EXAMPLE 4

This example illustrates the preparation of the reductive alkylation product of 1,2-ethylenediamine and methyl isobutyl ketone (EDA/MIBK2).

1,2-Ethylenediamine (1.6 mole), methyl isobutyl ketone (3.7 mole) and 5% Pd/C (2 wt % of total charge) were charged to a one liter stainless steel autoclave. The reactor was sealed and purged with nitrogen then hydrogen. The contents of the reactor were heated to 90° C. under 7 bar (100 psig) $H_2$. The pressure was increased to 55 bar (800 psig) and maintained throughout the reaction (31 hours) by the admission of hydrogen from a 1 gallon ballast on demand by a dome regulator. The reactor contents were analyzed by GC/FID and found to be 87.6 area % N,N'-dialkylated ethylenediamine. The product was purified by distillation at 112–114° C., 6.6 millibar (5 Torr).

EXAMPLE 5

This example illustrates the preparation of the reductive alkylation product of 1,3-propanediamine and methyl isobutyl ketone (PDA/MIBK).

1,3-Propanediamine (1.0 mole), methyl isobutyl ketone (2.2 mole) and 10% Pd/C (4 wt % of total charge) were charged to a one liter stainless steel autoclave and reacted as in Example 1 for 5 hours. The reactor contents were analyzed by GC/FID and found to be 92.6 area % N,N'-dialkylated 1,3-propanediamine. The product was purified by distillation at 113–115° C., 2.7 millibar (2 Torr).

EXAMPLE 6

This example illustrates the preparation of the reductive alkylation product of a butane-, cyclohexane- and hexanediamine mixture.

A 1,6-hexanediamine process byproduct stream containing a mixture of 1,4-butanediamine, 1,2-cyclohexanediamine, and 1,6-hexanediamine (0.9 mole), methyl isobutyl ketone (2.0 mole) and 10% Pd/C (4 wt % of total charge) were charged to a one liter stainless steel autoclave and reacted as in Example 1 for 4 hours. The reactor contents were analyzed by GC/FID and found to be 11.3 area % monoalkylated 1,2-cyclohexanediamine and 77.4% dialkylated materials. The monoalkylated product was removed by distillation at 126–128° C., 2.7 millibar (2 Torr). The dialkylated product was purified by distillation at 130–137° C., 1.3 millibar (1 Torr) to provide a sample containing (GC FID area % analysis) the reductive alkylation products of 1,4-butanediamine (11.5%), 1,2- cyclohexandiamine (46.6%), and 1,6-hexanediamine (38.7%). The structures of these materials are shown below.

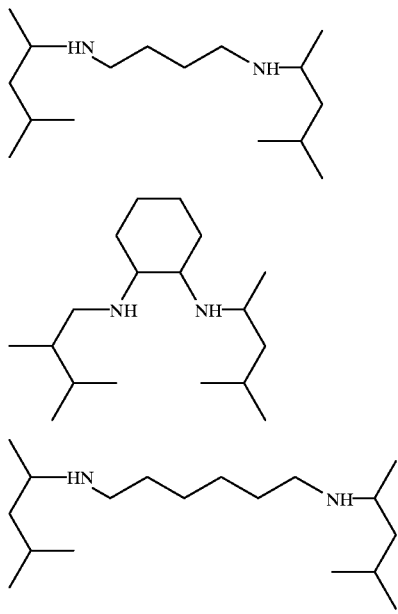

EXAMPLE 7

(a) A commercial photoresist based on a novolac-type cresol/formaldehyde resin and a diazonaphthoquinone (DNQ) photosensitive agent (SPR510A, Shipley) was coated on a 4 inch silicon wafer to a thickness of approximately 1 micron following the manufacturer's instructions. The photoresist was exposed to UV radiation centered at 365 nm (mercury i-line) through a variable transmission filter (from Opto-Line Associates, Wilmington Mass.), which consisted of a circular area on a quartz plate broken up into wedges of varying transmission levels. The resulting exposed wafer was developed (60 seconds) in a puddle of 0.262 M tetramethylammonium hydroxide (TMAH) containing sufficient EDA/MIBK2 (0.0225 wt %, 225 ppm) to lower the surface tension of the developer to 42 dynes/cm. The various portions of the wafer were then examined for film thickness using a Filmetrics F20 Thin-Film Measuring System (San Diego Calif.) and the results were compared to the film thicknesses before exposure and developing. The Normalized Film Thickness is a dimensionless ratio and was calculated by dividing the pre-exposure film thickness by the post-development film thickness. The results are shown in Table 1, Example 7(a). These data show outstanding selectivity of the developer solution for dissolution of the highly exposed resist vs. mildly exposed resist.

(b) Another commercially available photoresist (OCG 825 20 cS, Olin Corporation) was used to coat a 4 inch silicon wafer with a film thickness of approximately 1 micron. This resist is designed to be much more soluble in developer solutions and was used with 0.131M TMAH. Different areas of the resist were then exposed to UV radiation centered at 365 nm (mercury i-line) at various levels of intensity by positioning the wafer under an aperture opening and operating a shutter. Table 1, Example 7(b) shows data for the dissolution of exposed resist with 0.131 M TMAH containing EDA/MIBK2 (0.0175 wt %; 175 ppm) after 60 seconds development time. Again, the data show outstanding selectivity, even with this highly sensitive photoresist formulation.

TABLE 1

| Example 7(a) EDA/MIBK2 | | Example 7(b) EDA/MIBk2 | |
|---|---|---|---|
| Dose (mJ/cm$^2$) | Normalized Film Thickness | Dose (mJ/cm$^2$) | Normalized Film Thickness |
| 2.67 | 1.00 | 8.9 | 0.98 |
| 2.82 | 1.00 | 10.6 | 0.98 |
| 3.27 | 1.00 | 12.4 | 0.97 |
| 10.02 | 1.00 | 15.9 | 0.93 |
| 11.95 | 1.01 | 19.5 | 0.87 |
| 17.52 | 1.00 | 24.8 | 0.71 |
| 25.47 | 0.98 | 31.9 | 0.50 |
| 36.38 | 0.92 | 40.7 | 0.39 |
| 53.09 | 0.35 | 49.6 | 0.26 |
| 66.60 | 0.21 | 63.7 | 0.07 |
| 92.73 | 0.06 | 79.7 | 0 |
| 118.27 | 0 | 100.9 | 0 |
| 153.32 | 0 | | |
| 197.34 | 0 | | |
| 222.51 | 0 | | |

EXAMPLE 8

Foam tests were made in TMAH developer solutions formulated with EDA/MIBK2 and DETA/MIBK2 as surfactant and with three commercial developer solutions containing surfactants. Data were collected utilizing a foam generating apparatus whereby nitrogen gas was passed through a frit and bubbled through 100 mL of the solutions at 50 mL/min. Except for the commercial developer solutions which were used as received, all solutions contained 2.4 wt % TMAH in water with enough surfactant to lower surface tension to about 43 dyne/cm. The results are given in Table 2.

TABLE 2

| | Foam Volume (mL) | | | | |
|---|---|---|---|---|---|
| Time (min) | EDA/MIBK2 | DETA/MIBk2 | OCG 934 3:2[a] | MF-702[b] | MF-319[b] |
| 0 | 0 | 0 | 0 | 0 | 0 |
| 1 | 7.8 | 13.6 | 15.6 | 39.5 | 51.1 |
| 2 | 7.8 | 12.4 | 17.2 | 72.6 | 91.4 |
| 3 | 8.0 | 12.9 | 24.2 | 107.4 | 135.3 |
| 4 | 8.0 | 13.6 | 22.9 | 156.4 | 176.8 |
| 5 | 8.1 | 14.2 | 22.3 | 172.8 | 237.8 |
| 6 | 8.3 | 14.6 | 22.0 | 236.2 | 275.1 |
| 7 | 8.3 | 15.2 | 25.8 | 287.0 | 321.3 |
| 8 | 8.5 | 15.4 | 25.8 | 307.6 | 372.6 |
| 9 | 8.6 | 15.6 | 25.5 | 326.9 | 416.7 |
| 10 | 8.6 | 15.8 | 26.2 | 301.3 | 460.6 |
| 11 | 8.5 | 15.6 | 26.5 | 340.2 | 502.0 |
| 12 | 8.5 | 15.8 | 26.9 | 404.8 | 544.9 |
| 13 | 8.5 | 15.8 | 26.9 | 438.6 | 594.7 |
| 14 | 8.6 | 15.8 | 26.9 | 488.6 | 647.5 |
| 15 | 8.7 | 16.2 | 27.3 | 514.9 | 681.1 |

[a]Commercial developer solution from Olin (now Arch Chemical)
[b]Commercial developer marketed under the Micropost ® trademark by Shipley The above data in Table 2 show that TMAH developer solutions containing the EDA/MIBK2 and DETA/MIBK2 as the surfactant developed considerably less foam than the commercial developer solutions containing other types of surfactant. It is quite surprising that alkylated polyamines containing C5–C8 alkyl groups increases the ability of these materials to reduce both surface tension and foaming tendency in TMAH developer solutions while maintaining good contrast for photoresist developing applications. These goals are achieved while lowering the level of alkylated polyamine required for a desired surface tension reduction.

EXAMPLE 9

Table 3 presents additional data indicating the low foam associated with the alkylated polyamine wetting agents in a 0.262N TMAH solution were obtained using the Ross-Miles technique.

TABLE 3

| Polyamine | Conc (ppm) | R-M Foam Initial (t to 0) |
|---|---|---|
| EDA/MIBK2 | 175 | 1.0 cm (13 s) |
| DETA/MIBK2 | 400 | 2.0 cm (18 s) |

By comparison, N-dodecyl diethylenetriamine (DETA/DDA1), a derivative with a long linear side-chain, at a concentration of only 40 ppm showed an initial foam height of 8.3 cm which was almost completely stable for five minutes at which time the foam was still 7.5 cm in height.

In sum, the ability of a surfactant to reduce surface tension under both equilibrium and dynamic conditions is of great importance in the performance of waterbased photoresist developers. Low dynamic surface tension results in enhanced wetting and spreading under the dynamic conditions of application, resulting in more efficient use of the compositions and fewer defects. Foam control is a particularly important attribute in photoresist developer/electronics cleaning compositions. The present invention affords these attributes while maintaining good contrast for photoresist developing application.

STATEMENT OF INDUSTRIAL APPLICATION

The invention provides compositions suitable for use in photoresist developer/electronics cleaning compositions.

We claim:

1. In an aqueous photoresist developer composition containing a surfactant, the improvement which comprises employing as the surfactant a dialkyl polyamine compound of the structure I or II

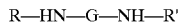

where R and R' are independently C5 to C8 alkyl, G is a C2–C6 linear or cyclic alkylene group which may contain C1–C4 alkyl substituents, m is 2–6, and n is 2 or 3.

2. The developer composition of claim 1 in which an aqueous solution of the dialkyl polyamine demonstrates a dynamic surface tension of less than 45 dynes/cm at a concentration of ≦5 wt % in water at 23° C. and 1 bubble/second according to the maximum-bubble-pressure method.

3. The developer composition of claim 1 in which the polyamine has structure I.

4. The developer composition of claim 1 in which the polyamine has structure II.

5. The developer composition of claim 3 in which G is ethylene or propylene.

6. The developer composition of claim 4 in which m is 2 or 3.

7. The developer composition of claim 2 in which the alkylated polyamine is the reductive alkylation product of diethylenetriamine, di-(3-aminopropyl)amine, ethylenediamine, propanediamine, butanediamine, cyclohexanediamine or hexanediamine with methyl isobutyl ketone or methyl isoamyl ketone.

8. The developer composition of claim 1 which contains tetramethylammonium hydroxide.

9. The developer composition of claim 5 which contains tetramethylammonium hydroxide.

10. The developer composition of claim 6 which contains tetramethylammonium hydroxide.

11. In a process for developing a photoresist after exposure to radiation by applying to the photoresist surface a developer solution containing a surface tension lowering amount of a surfactant, the improvement which comprises using as the surfactant a dialkyl polyamine compound having structure I or II

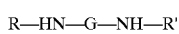

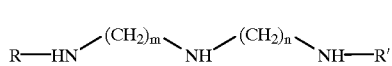

where R and R' are independently C5 to C8 alkyl, G is a C2–C6 linear or cyclic alkylene group which may contain C1–C4 alkyl substituents, m is 2–6, and n is 2 or 3.

12. The process of claim 11 in which the polyamine has structure I.

13. The process of claim 11 in which the polyamine has structure II.

14. The process of claim 12 in which G is ethylene or propylene.

15. The process of claim 13 in which m is 2 or 3.

16. The process of claim 12 in which the alkylated polyamine is the reductive alkylation product of diethylenetriamine, di-(3-aminopropyl)amine, ethylenediamine, propanediamine, butanediamine, cyclohexanediamine or hexanediamine with methyl isobutyl ketone or methyl isoamyl ketone.

17. The process of claim 11 which contains tetramethylammonium hydroxide.

18. The process of claim 14 which contains tetramethylammonium hydroxide.

19. The process of claim 15 which contains tetramethylammonium hydroxide.

20. The process of claim 16 which contains tetramethylammonium hydroxide.

21. An aqueous electronics cleaning composition comprising in water the following components 0.1 to 3 wt % tetramethylammonium hydroxide, 0 to 4 wt % phenolic compound; and 10 to 10,000 ppm dialkyl polyamine, the dialkyl polyamine compound having structure I or II

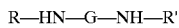

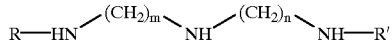
where R and R' are independently C5 to C8 alkyl, G is a C2–C6 linear or cyclic alkylene group which may contain C1–C4 alkyl substituents, m is 2–6, and n is 2 or 3.
* * * * *